(12) United States Patent
Zhou

(10) Patent No.: US 9,357,637 B2
(45) Date of Patent: May 31, 2016

(54) FLEXIBLE SUBSTRATE, SUPPORT PLATFORM, FLEXIBLE DISPLAY AND MANUFACTURING METHOD THEREOF

(71) Applicant: BOE Technology Group Co., Ltd., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/017,771

(22) Filed: Sep. 4, 2013

(65) Prior Publication Data

US 2014/0065388 A1    Mar. 6, 2014

(30) Foreign Application Priority Data

Sep. 5, 2012 (CN) .......................... 2012 1 0326172

(51) Int. Cl.
| | |
|---|---|
| C09K 19/00 | (2006.01) |
| B32B 7/04 | (2006.01) |
| H05K 1/02 | (2006.01) |
| H05K 3/00 | (2006.01) |
| G02F 1/1333 | (2006.01) |
| G02F 1/1339 | (2006.01) |

(52) U.S. Cl.
CPC ............ *H05K 1/028* (2013.01); *G02F 1/13394* (2013.01); *G02F 1/133305* (2013.01); *H05K 3/00* (2013.01); *Y10T 29/49002* (2015.01); *Y10T 428/24802* (2015.01); *Y10T 428/24917* (2015.01); *Y10T 428/24926* (2015.01)

(58) Field of Classification Search
CPC ..................... A01B 12/006; Y10T 428/24926; Y10T 428/24917; Y10T 249/24802
USPC .......... 428/1.1, 1.23, 1.3, 119, 220, 688, 689, 428/699; 257/40, 686
See application file for complete search history.

(56) References Cited

U.S. PATENT DOCUMENTS

| | | | | |
|---|---|---|---|---|
| 5,978,061 A * | 11/1999 | Miyazaki | ............ | G02F 1/13394 349/106 |
| 6,316,786 B1 * | 11/2001 | Mueller et al. | ................. | 257/40 |
| 6,437,847 B1 * | 8/2002 | Kishimoto | .......... | G02F 1/13334 349/106 |
| 6,778,251 B1 * | 8/2004 | Austin | .............. | G02F 1/133382 349/139 |
| 6,801,290 B2 * | 10/2004 | Kim | ..................... | G02F 1/13394 349/155 |
| 7,180,237 B2 * | 2/2007 | Onozuka et al. | .............. | 313/500 |
| 7,397,466 B2 * | 7/2008 | Bourdelais et al. | ........... | 345/173 |
| 7,615,325 B2 * | 11/2009 | Liang | ..................... | C08G 77/38 252/299.01 |

(Continued)

FOREIGN PATENT DOCUMENTS

TW    I242089 B    10/2005

OTHER PUBLICATIONS

First Office Action issued by the Chinese Patent Office for Chinese Patent Application No. 201210326172.9 dated Aug. 5, 2014, 6pgs.

(Continued)

*Primary Examiner* — Lauren R Colgan
(74) *Attorney, Agent, or Firm* — Ladas & Parry LLP

(57) ABSTRACT

The invention relates to manufacturing of displays. A flexible substrate is disclosed, which has a plurality of spacers arranged at intervals on one side thereof. The invention also discloses a support platform with spacers arranged at intervals, a flexible display formed from the flexible substrate with the spacers arranged at intervals and a method for manufacturing the flexible display.

11 Claims, 3 Drawing Sheets

(56) References Cited

U.S. PATENT DOCUMENTS

| | | | |
|---|---|---|---|
| 7,868,545 B2* | 1/2011 | Hioki et al. | 313/511 |
| 8,610,649 B2* | 12/2013 | Kwon | G02F 1/133305 345/82 |
| 2005/0099577 A1* | 5/2005 | Lee | G02F 1/13394 349/155 |
| 2005/0259189 A1* | 11/2005 | Bouten | G02F 1/13394 349/1 |
| 2006/0146207 A1* | 7/2006 | Cho | G02F 1/13338 349/12 |
| 2007/0176321 A1* | 8/2007 | Oh | B29C 33/3842 264/219 |
| 2008/0018631 A1* | 1/2008 | Hioki | G02F 1/133526 345/206 |
| 2008/0055831 A1* | 3/2008 | Satoh | G02F 1/133305 361/600 |
| 2013/0032282 A1* | 2/2013 | Lee | G06F 1/1333 156/247 |

OTHER PUBLICATIONS

English translation of First Office Action issued by the Chinese Patent Office for Chinese Patent Application No. 201210326172.9 dated Aug. 5, 2014, 4pgs.

Office Action issued by the Chinese Patent Office for Chinese Patent Application No. 201210326172.9 dated Feb. 17, 2014, 4 pgs.

English translation of Second Office Action issued by the Chinese Patent Office for Chinese Patent Application No. 201210326172.9 dated Feb. 17, 2015, 3 pgs.

\* cited by examiner

FLEXIBLE SUBSTRATE, SUPPORT PLATFORM, FLEXIBLE DISPLAY AND MANUFACTURING METHOD THEREOF

CROSS REFERENCE TO RELATED APPLICATIONS

This application claims priority from Chinese National Application No. 201210326172.9 filed on Sep. 5, 2012, the contents of which are incorporated herein by reference.

TECHNICAL FIELD

The invention relates to a flexible substrate, a support platform, a flexible display and a manufacturing method thereof.

BACKGROUND

LCD display technology has been developed tremendously in the last decade, with substantial improvements in both screen's dimension and display quality. With the development in flexible display technology, flexible display products more similar to the conventional ones are approaching to the daily life. Due to the inherent flexible property of the flexible displays, such products will bring in a variety of special user experiences.

In a conventional display manufacturing method, the adjoined state of a flexible substrate to a support platform is shown in FIG. 1, wherein one side of the flexible substrate 02 is adjoined to the support platform 01, and a structure for pixel display is formed on the other side of the flexible substrate 02. As the flexible substrate 02 per se is relatively thin and has a large area, usually there is gas entrapped between the flexible substrate 02 and the support platform 01 when the flexible substrate 02 is adjoined to the support platform 01, due to the less than optimal smoothness of the support platform 01. In such case, a part of the gas is not communicated to the environment, such that it may be difficult to be expelled. Such part of the gas may thus lead to blistering on the flexible substrate 02. In addition, during manufacturing of the structure for pixel display, with such part of the gas, the smoothness of the flexible substrate 02 is likely to be affected, thereby readily leading to undesired warpage.

SUMMARY

The invention provides a flexible substrate, which can decrease blistering and warpage during manufacturing of flexible displays.

The invention also provides a support platform, which can increase smoothness of the support platform for adjoining to the flexible substrate.

In addition, the invention further provides a flexible display and a manufacturing method thereof, which can improve quality of flexible displays.

In accordance with embodiments of the invention, a flexible substrate is provided, which has a plurality of spacers arranged at intervals on one side thereof.

Preferably, the distance between any two adjacent spacers is from 10 to 500 μm.

Preferably, the spacers are arranged in an array, wherein each of the spacers has a cuboid structure, with a height thereof ranging from 0.25 to 10 μm. Further, each of the spacers may have a length and a width ranging from 10 to 500 μm.

Preferably, each of the spacers has a cross-section shape of a trapezoid, a triangle, or a diamond.

Preferably, the spacer is made of one of resin, silicon oxide, silicon nitride and metal oxide, or a combination thereof.

Preferably, the flexible substrate is one of an ultra-thin glass substrate, a plastic substrate and a metal substrate, or a combination thereof.

In accordance with the embodiments of the invention, a support platform for a flexible substrate is also provided, which comprises a plurality of spacers arranged at intervals on the surface of the support platform for adjoining to the flexible substrate.

Preferably, the distance between any two adjacent spacers is from 10 to 500 μm.

Preferably, the spacers are arranged in an array, wherein each of the spacers has a cuboid structure, with a height thereof ranging from 0.25 to 10 μm. Further, each of the spacers may have a length and a width ranging from 10 to 500 μm.

Preferably, each of the spacers has a cross-section shape of a trapezoid, a triangle, or a diamond.

Preferably, the spacer is made of one of resin, silicon oxide, silicon nitride and metal oxide, or a combination thereof.

Preferably, the support platform is one of a glass substrate, a metal substrate, and a ceramic substrate, or a combination thereof.

In accordance with the embodiments of the invention, a flexible display is further provided, with a flexible substrate described with respect to the technical solutions mentioned above.

In accordance with the embodiments of the invention, a method for manufacturing a flexible display is further provided, which comprises:

forming a plurality of spacers arranged at intervals on one side of a flexible substrate;

adjoining said one side of the flexible substrate with the spacers to a support platform; and forming a structure for pixel display on the other side of the flexible substrate.

Preferably, the spacers are formed by printing, or by film-forming, mask exposure, and etching.

DETAILED DESCRIPTION OF THE PREFERRED EMBODIMENTS

The technical solutions of the embodiments of the present application are described below in details in conjunction with the accompanied drawings. It is obvious the embodiments described are merely a part of the embodiments of the present application. All other embodiments that can be obtained by those skilled in the art based on the embodiments of the present application without creative labor are within the protection scope of the present application.

First Embodiment

Figure 1:
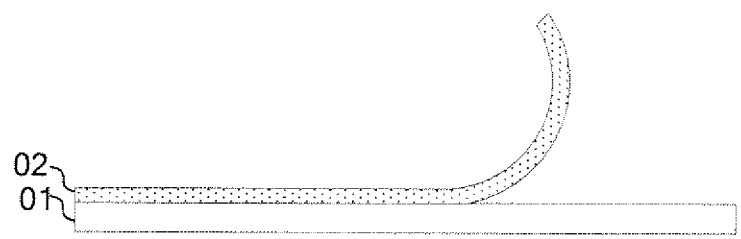
FIG. 1 is a schematic view of a prior art flexible substrate in a state of being adjoined to a support platform.
Figure 2:
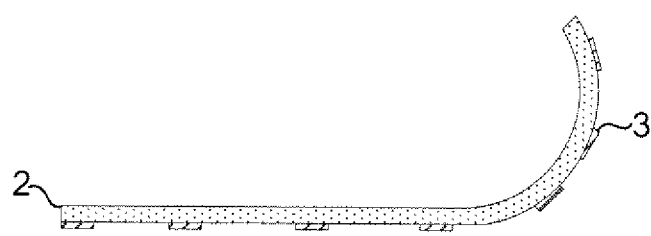
FIG. 2 is a schematic view of a flexible substrate in accordance with the embodiments of the invention.

This embodiment provides a flexible substrate 2 as shown in FIG. 2, which comprises spacers 3. The spacers 3 are disposed on a side of the flexible substrate opposing to the side on which the structure for pixel display is formed.

When using the flexible substrate 2 of such a structure for manufacturing a flexible display, the side of the flexible substrate 2 with the spacers 3 arranged at intervals thereon is adjoined to the support platform 1, with the spacers 3 disposed between the flexible substrate 2 and the support platform 1. The gaps between the spacers 3 arranged at intervals may allow communication of the gas between the flexible substrate 2 and the support platform 1 with the environment, so as to facilitate expelling of the gas. The smoothness of the adjoining of the flexible substrate 2 is thus improved, thereby decreasing undesired blistering and warpage of the flexible substrates during the manufacturing of flexible displays.

Therefore, using the flexible substrate 2 in accordance with the embodiments of the invention for manufacturing a flexible display may decrease blistering and warpage during the manufacturing.

Figure 3:
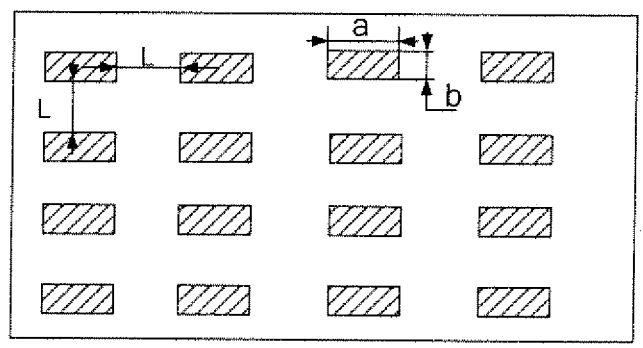
FIG. 3 is a schematic view of a plurality of spacers arranged at intervals on the flexible substrate in accordance with the embodiments of the invention.

In one preferred embodiment, specifically, the spacers are arranged in an array, as shown in FIG. 3, and the distance L between any two adjacent spacers 4 is from 10 to 500 µm, such as: 10 µm, 20 µm, 30 µm, 40 µm, 60 µm, 80 µm, 100 µm, 150 µm, 200 µm, 240 µm, 260 µm, 300 µm, 350 µm, 400 µm, 450 µm, 500 µm etc. The gaps between the spacers 3 arranged at intervals may allow communication of the gas between the flexible substrate 2 and the support platform 1 with the environment, so as to facilitate expelling of the said gas and allow a smooth adjoining of the flexible substrate 2 to the support platform 1.

The spacers 3 are arranged in an array, and each of the spacers 3 has a cuboid structure, with the length a and the width b thereof ranging from 10 to 500 µm, and the height h thereof ranging from 0.25 to 10 µm. Each of the spacers 4 has a cuboid structure, so as to facilitate production thereof. The length a and the width b of each spacer can be for example: 10 µm, 20 µm, 30 µm, 40 µm, 60 µm, 80 µm, 100 µm, 150 µm, 200 µm, 240 µm, 260 µm, 300 µm, 350 µm, 400 µm 450 µm, 500 µm etc., and the height h thereof can be for example: 0.25 µm, 0.85 µm, 1.25 µm, 1.75 µm, 3 µm, 3.5 µm, 4 µm, 5 µm, 7 µm, 9.25 µm, 10 µm etc. If the spacer 3 has a height less than 0.25 µm, the gas between the flexible substrate 2 and the support platform 1 can not flow ideally; if the spacer 3 has a height larger than 10 µm, a relative displacement between the flexible substrate 2 and the support platform 1 can be easily caused during manufacturing, requiring additional adjustments of the manufacturing equipments such as an air knife and a heating plate when switching between manufacturing of a flexible substrate and that of a non-flexible substrate.

Of course, the length a and the width b are identical for each of the spacers.

Figure 4:
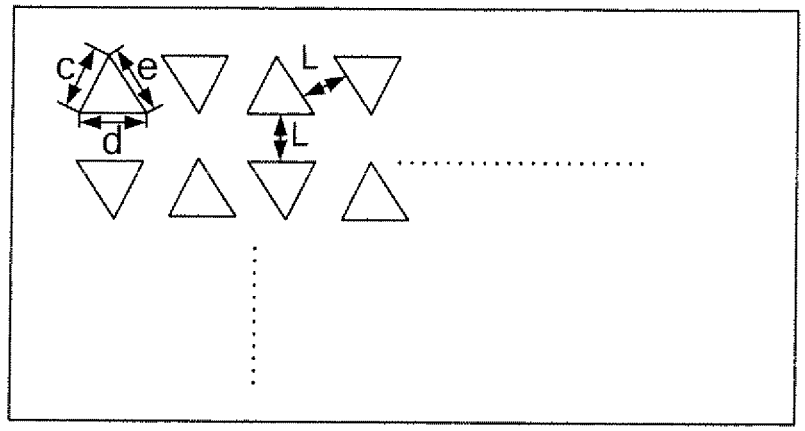
FIG. 4 is a schematic view of a plurality of spacers arranged at intervals on the flexible substrate in accordance with the embodiments of the invention.

The spacer 3 can be of any other cross-section shapes, such as a trapezoid, a triangle, etc., as shown in FIG. 4. The dimensions of the three sides of the triangle are from 10 to 500 µm, such as: 10 µm, 20 µm, 30 µm, 40 µm, 60 µm, 80 µm, 100 µm, 150 µm, 200 µm, 240 µm, 260 µm, 300 µm, 350 µm, 400 µm, 450 µm, 500 µm etc. The longest side of the trapezoid is from 10 to 500 µm, such as: 10 µm, 20 µm, 30 µm, 40 µm, 60 µm, 80 µm, 100 µm, 150 µm, 200 µm, 240 µm, 260 µm, 300 µm, 350 µm, 400 µm, 450 µm, 500 µm etc. The distance L between any two adjacent spacers 3 is from 10 to 500 µm, such as: 10 µm, 20 µm, 30 µm, 40 µm, 60 µm, 80 µm, 100 µm, 150 µm, 200 µm, 240 µm, 260 µm, 300 µm, 350 µm, 400 µm, 450 µm, 500 µm etc. Here, unnecessary details are omitted.

The spacer 3 can be made of one of resin, silicon oxide, silicon nitride and metal oxide, or a combination thereof.

The flexible substrate 2 can be one of an ultra-thin glass substrate, a plastic substrate, and a metal substrate, or can have a multi-layer structure comprising at least two of an ultra-thin glass layer, a plastic layer and a metal layer.

Second Embodiment

Figure 5:
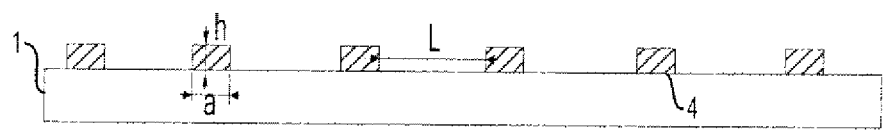
FIG. 5 is a schematic view of a support platform in accordance with the embodiments of the invention.

This embodiment of the invention provides a support platform 1, as shown in FIG. 5, which comprises the spacers 4 arranged at intervals and disposed on the side of the support platform 1 supporting the flexible substrate 2.

The side of support platform 1 for adjoining to the flexible substrate 2 is provided with a plurality of spacers 4 arranged at intervals, with gaps between such spacers allowing communication of the gas between the flexible substrate 2 and the support platform 1 with the environment. Expelling of the gas between the support platform 1 and the flexible substrate 2 is thus facilitated, and the smoothness of the side of the support platform 1 adjoining to the flexible substrate is further improved, so as to improve the smoothness of the side of the display 5 made by adjoining the flexible substrate 2 to the support platform 1.

Therefore, with the support platform 1 in accordance with the embodiments of the invention, the smoothness of the side of the support platform 1 adjoining to the flexible substrate 2 can be improved, and blistering and warpage of the flexible substrate 2 can also be reduced during manufacturing of the flexible displays.

In one preferable embodiment, the distance L between any two adjacent spacers is from 30 to 500 µm. The gaps between the spacers 4 arranged at intervals can allow communication of the gas between the flexible substrate 2 and the support platform 1 with the environment, so as to facilitate expelling of said gas and allow a smooth adjoining of the flexible substrate 2 to the support platform 1.

As shown in FIGS. 3 and 5, the spacers 4 are arranged in an array, and each of the spacers 4 has a cuboid structure, with the length a and the width b thereof ranging from 10 to 500 µm, and the height h thereof ranging from 0.25 to 10 µm. The spacers 4 have cuboid structures, so as to facilitate production. The length a and the width b of each spacer can be for example: 10 µm, 20 µm, 30 µm, 40 µm, 60 µm, 80 µm, 100 µm, 150 µm, 200 µm, 240 µm, 260 µm, 300 µm, 350 µm, 400 µm, 450 µm, 500 µm etc., and the height h thereof can be for example: 0.25 µm, 0.85 µm, 1.25 µm, 1.75 µm, 3 µm, 3.5 µm, 4 µm, 5 µm, 7 µm, 9.25 µm, 10 µm etc. If the spacer 4 has a height less than 0.25 µm, the gas between the flexible substrate 2 and the support platform 1 can not flow ideally; and if the spacer 4 has a height larger than 10 µm, a relative displacement between the flexible substrate 2 and the support platform 1 can be easily caused during manufacturing, requiring additional adjustments of the manufacturing equipments such as an air knife and a heating plate when switching between manufacturing of a flexible substrate and that of a non-flexible substrate.

Of course, the length and the width b can be identical for each of the spacers.

The spacer 4 can be of any other cross-section shapes, such as a trapezoid, a triangle, etc., as shown in FIG. 4. The dimensions of the three sides of the triangle are from 10 to 500 µm, such as: 10 μm, 20 μm, 30 μm, 40 μm, 60 μm, 80 μm, 100 μm, 150 μm, 200 μm, 240 μm. 260 μm, 300 μm, 350 μm, 400 μm, 450 μm, 500 μm etc. The longest side of the trapezoid is from 10 to 500 μm, such as: 10 μm, 20 μm, 30 μm, 40 μm, 60 μm, 80 μm, 100 μm, 150 μm, 200 μm, 240 μm, 260 μm, 300 μm, 350 μm, 400 μm, 450 μm, 500 μm etc. The distance L between any two adjacent spacers 4 is from 10 to 500 μm, such as: 10 μm, 20 μm, 30 μm, 40 μm, 60 μm, 80 μm, 100 μm, 150 μm, 200 μm, 240 μm, 260 μm, 300 μm, 350 μm, 400 μm, 450 μm, 500 μm etc. Here, unnecessary details are omitted.

The spacer 4 can be made of one of resin, silicon oxide, silicon nitride and metal oxide, or a combination thereof The support platform can be one of a glass substrate, a metal substrate and a ceramic substrate, or a combination thereof. The combination can be made by stacking these substrates layer by layer to form a complex substrate.

Third Embodiment

Figure 6:
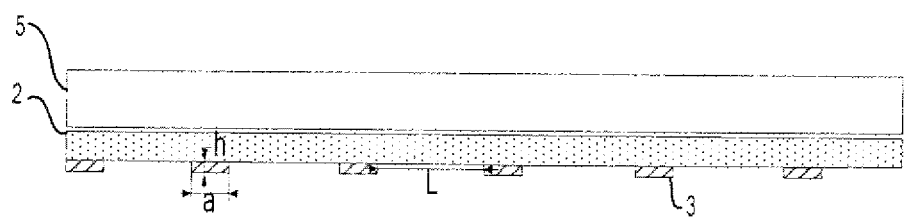
FIG. 6 is a schematic view of a flexible display manufactured in accordance with the embodiments of the invention.

This embodiment of the invention provides a flexible display, as shown in FIG. 6, which comprises the flexible substrate 2 as described with respect to the above mentioned technical solutions.

As in the flexible substrate 2 of the flexible display, the other side of the flexible substrate 2 which is opposite to the side thereof for forming a structure for pixel display, is provided with the spacers 3 arranged at intervals, the gaps between the spacers 3 arranged at intervals may allow communication of the gas between the flexible substrate 2 and the support platform 1 with the environment during manufacturing of the flexible display, thereby facilitating expelling of the gas. Blistering of the flexible substrate 2 is thus reduced during manufacturing of the flexible displays, thereby improving the quality of the flexible display.

Fourth Embodiment

This embodiment of the invention provides a method for manufacturing a flexible display, which comprises:

Step S701, forming a plurality of spacers 3 arranged at intervals on one side of the flexible substrate 2, for example by printing, or by film-forming, mask exposure, and etching.

Step S702, adjoining said one side of the flexible substrate 2 with the spacers 3 to the support platform 1, with gaps between such spacers 3, allowing communication of the gas between the flexible substrate 2 and the support platform 1 with the environment.

Step S703: forming a structure for pixel display on the other side of the flexible substrate 2.

Figure 7:
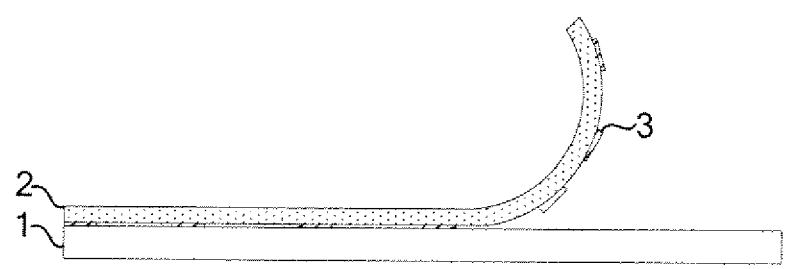
FIG. 7 is a schematic view of a flexible substrate having spacers in accordance with the embodiments of the invention in a state of being adjoined to the support platform.

In the present embodiment, a plurality of spacers 3 are formed on one side of the flexible substrate 2, as shown in FIG. 7, said one side of the flexible substrate 2 with the spacers 3 formed thereon is adjoined to the support platform 1, with the spacers 3 arranged at intervals interposed between the flexible substrate 2 and the support platform 1. The gaps between the spacers 3 arranged at intervals can allow communication of the gas between the flexible substrate 2 and the support platform 1 with the environment, so as to facilitate expelling of the gas. Blistering of the flexible substrates during the manufacturing of the flexible displays is thus reduced, improving the smoothness of the flexible substrate 2 during adjoining, thereby reducing warpage.

Therefore, with the method for manufacturing a flexible display in accordance with the embodiments of the invention, blistering of the flexible substrate can be reduced during manufacturing of the flexible displays, thereby improving the quality of the flexible displays.

The spacers 3 can be formed on one side of the flexible substrate 2 by printing, or by film-forming, mask exposure, and etching.

Obviously, those skilled in the art can contemplate various amendments and modifications to the invention, without departing the spirit and the scope thereof. That is, if such amendments and modifications to the invention are within the scope of the claims and the equivalents thereof, they shall be construed as being covered by the present invention.

What is claimed is:

1. A flexible substrate for a flexible LCD display, wherein a plurality of spacers are arranged at intervals on one side of the flexible substrate opposing a side on which a structure for pixel display is formed, wherein the distance between any two adjacent ones of the plurality of spacers is from 10 to 500 μm, and wherein the spacers are arranged in an array, and each of the spacers has a cuboid structure with a height thereof ranging from 0.25 to 10 μm.

2. The flexible substrate in accordance with claim 1, wherein each of the spacers has a length and a width ranging from 10 to 500 μm.

3. The flexible substrate in accordance with claim 1, wherein the spacers are made of one of resin, silicon oxide, silicon nitride and metal oxide, or a combination thereof.

4. The flexible substrate in accordance with claim 1, wherein the flexible substrate is one of an ultra-thin glass substrate, a plastic substrate, a metal substrate or a combination thereof.

5. A support platform for a flexible substrate of a flexible LCD display, comprising a plurality of spacers arranged at intervals on a surface of the support platform for flexible substrate, wherein the distance between any two adjacent ones of the plurality of spacers is from 10 to 500 μm, and wherein the spacers are arranged in an array, and each of the spacers has a cuboid structure with a height thereof ranging from 0.25 to 10 μm.

6. The support platform in accordance with claim 5, wherein each of the spacers has a length and a width ranging from 10 to 500 μm.

7. The support platform in accordance with claim 5, wherein the spacers are made of one of resin, silicon oxide, silicon nitride and metal oxide, or a combination thereof.

8. The support platform in accordance with claim 5, wherein the support platform is one of a glass substrate, a metal substrate and a ceramic substrate, or a combination thereof.

9. A flexible display, comprising a flexible substrate, wherein a plurality of spacers are arranged at intervals on one side of the flexible substrate opposing a side on which a structure for pixel display is formed, wherein the distance between any two adjacent ones of the plurality of spacers is from 10 to 500 μm, and wherein the spacers are arranged in an array, and each of the spacers has a cuboid structure with a height thereof ranging from 0.25 to 10 μm.

10. A method for manufacturing a flexible display, comprising:

forming a plurality of spacers arranged at intervals on one side of a flexible substrate, wherein the distance between any two adjacent ones of the plurality of spacers is from 10 to 500 μm, and wherein the spacers are arranged in an array, and each of the spacers has a cuboid structure with a height thereof ranging from 0.25 to 10 μm;

adjoining said one side of the flexible substrate with the spacers to a support platform;

and forming a structure for pixel display on the other side of the flexible substrate.

11. The method for manufacturing a flexible display in accordance with claim 10, wherein the spacers are formed by printing, or by film-forming, mask exposure, and etching.

* * * * *